United States Patent [19]

Saijo et al.

[11] Patent Number: 4,896,813
[45] Date of Patent: Jan. 30, 1990

[54] METHOD AND APPARATUS FOR COLD ROLLING CLAD SHEET

[75] Inventors: Kinji Saijo, Kudamatsu; Tsukasa Fujimura, Yamaguchi; Kazuo Yoshida, Hikari, all of Japan

[73] Assignee: Toyo Kohan Co., Ltd., Tokyo, Japan

[21] Appl. No.: 332,834

[22] Filed: Apr. 3, 1989

[51] Int. Cl.[4] ............... B23K 20/04; B23K 20/14; B23K 20/24

[52] U.S. Cl. ................... 228/116; 228/117; 228/205; 228/243; 228/3.1; 228/5.1; 219/78.02; 219/78.14; 204/192.32

[58] Field of Search .......... 228/115, 116, 117, 265, 228/205, 221, 243, 3.1, 5.1; 219/78.14, 78.02; 204/192.32

[56] References Cited

U.S. PATENT DOCUMENTS 4,245,768  1/1981  Sater ............... 204/192.32
4,452,389  6/1984  Amin ............... 228/116

OTHER PUBLICATIONS

Sherwood, W. C., and Milner, D. R., "The Effect of Vacuum Machining on the Cold Welding of Some Metals", Journal of the Institute of Metals, vol. 97, 1969.

Primary Examiner—Nicholas P. Godici
Assistant Examiner—Samuel M. Heinrich
Attorney, Agent, or Firm—Felfe & Lynch

[57] ABSTRACT

Metals to be bonded are drawn from pay-off reels and passed around holding rollers which are grounded cathodes, each roller being partially exposed in an etching chamber having an anode area at least three times the exposed area of the cathode. Each chamber has an inert gas at from $10^{-4}$ to $10^{-1}$ Torr and is subjected to RF power with a frequency from 1 to 50 MHz, which by a magnetic field produced by fixed magnets in the holding roller produces a glow discharge plasma which etches the metal in the chamber. Etched surfaces of the strips are then rolled together in a vacuum of from $10^{-6}$ to $10^{-3}$ Torr and a temperature to 300° C. at a rolling pressure sufficient to effect a thickness reduction from 0.1 to 30%.

10 Claims, 8 Drawing Sheets

AMORPHOUS
METAL

ALUMINUM 0.1mm

FIG. 11.

| | | metal to be clad of | | Cleaning condition | | metal to be clad with | | | rolling condition | | | Adhesion test | |
|---|---|---|---|---|---|---|---|---|---|---|---|---|---|
| | metal | thickness mm | oxide thickness Å | etching thickness Å | metal | thickness mm | oxide thickness Å | etching thickness Å | vacuum Torr. | reduction % | bonding strength kg/10mm | Erichsen test | 180° bending test |
| Example 1 | Fe | 0.23 | 200 | 400 | Al | 0.26 | 1800 | 3000 | 1x10⁻⁶ | 25 | 45< | ○ | ○ |
| Example 2 | Fe | 0.23 | 200 | 400 | Al | 0.26 | 1800 | 1000 | 3x10⁻⁵ | 5 | 14 | ○ | ○ |
| Example 3 | Fe | 0.23 | 200 | 400 | Al | 0.26 | 1800 | 2000 | 5x10⁻⁵ | 5 | 25 | ○ | ○ |
| Example 4 | Fe | 0.23 | 200 | 400 | Al | 0.03 | 1800 | 3000 | 1x10⁻⁵ | 0.5 | 2< | ○ | ○ |
| Example 5 | Fe | 0.23 | 200 | 400 | Al | 0.26 | 1800 | 1000 | 1x10⁻⁵ | 5 | 15 | ○ | ○ |
| Example 6 | Fe | 0.23 | 200 | 400 | Cu | 0.3 | 50 | 500 | 5x10⁻⁵ | 30 | 50< | ○ | ○ |
| Example 7 | Fe | 0.23 | 200 | 400 | Cu | 0.3 | 50 | 200 | 2x10⁻⁵ | 1.2 | 10 | ○ | ○ |
| Example 8 | Fe | 0.23 | 200 | 400 | Cu | 0.05 | 50 | 200 | 8x10⁻⁴ | 1.5 | 4 | ○ | ○ |
| Example 9 | Amorphous Fe-Ni-Cr-Si-B | 0.1 | 100 | 200 | Al | 0.1 | 900 | 1500 | 1x10⁻⁶ | 3 | 5< | – | – |
| Example 10 | Amorphous Fe-Ni-Cr-Si-B | 0.1 | 100 | 200 | Cu | 0.05 | 60 | 100 | 5x10⁻⁴ | 3 | 5< | – | – |
| Example 11 | Cu | 0.3 | 50 | 200 | Al | 0.5 | 1800 | 3000 | 4x10⁻⁶ | 20 | 45< | ○ | ○ |
| Example 12 | Mo | 0.5 | 1200 | 3000 | Al | 0.5 | 1800 | 3000 | 1x10⁻⁶ | 15 | 42< | – | – |
| Example 13 | Zn | 1.0 | 1000 | 2000 | Al | 0.5 | 1800 | 3000 | 3x10⁻⁵ | 10 | 36< | ○ | ○ |
| Example 14 | Ti | 0.16 | 1400 | 3000 | Al | 0.5 | 1800 | 3000 | 2x10⁻⁵ | 7.5 | 42< | ○ | ○ |
| Example 15 | SUS304 | 0.3 | 400 | 3000 | Al | 0.5 | 1800 | 3000 | 5x10⁻⁵ | 8 | 42< | ○ | ○ |
| Comparison 1 | Fe | 0.23 | 200 | 0 | Al | 0.26 | 1800 | 0 | 2x10⁻⁵ | 5 | 0 | × | × |
| Comparison 2 | Fe | 0.23 | 200 | 400 | Al | 0.26 | 1800 | 0 | 1x10⁻⁴ | 5 | 0 | × | × |
| Comparison 3 | Fe | 0.23 | 200 | 0 | Al | 0.26 | 1800 | 3000 | 1x10⁻⁵ | 5 | 0 | × | × |
| Comparison 4 | Fe | 0.23 | 200 | 400 | Al | 0.26 | 1800 | 3000 | 760 | 5 | 0 | × | × |
| Comparison 5 | Fe | 0.23 | 200 | 400 | Al | 0.26 | 1800 | 3000 | 1x10⁻² | 1 | 3 | △ | △ |
| Comparison 6 | Fe | 0.23 | 200 | 400 | Cu | 0.3 | 50 | 0 | 1x10⁻⁵ | 5 | 0 | × | × |

METHOD AND APPARATUS FOR COLD ROLLING CLAD SHEET

BACKGROUND OF THE INVENTION

1. Field of the Invention

This invention relates to methods ad apparatus for making clad sheets, which have high bonding strength, by low reduction cold rolling in vacuum without heating.

2. Description of the Prior Art

There have been many manufacturing processes developed for the cladding of a variety of metals with other dissimilar metal, such as (1) hot rolling, (2) cold rolling, (3) explosion bonding, (4) a combination of processes mentioned using insert metal, (5) brazing, (6) welding, and (7) using organic adhesive material. Of these processes, (1), (2), and (3) are continuous processes for cladding of metal sheet with other metal sheet, which achieve tight metal bonding.

In the case of hot rolling to clad steel with a dissimilar metal, it is necessary to heat above 800° C., therefore it is impossible to clad with a metal having a melting point lower than 800° C. In many cases of the combination of dissimilar metals, thick brittle intermetallic alloys or compounds, which result in poor formability of the clad sheet product, are created at high rolling temperature. The residual oxide films in the bonding interface occasionally introduce bonding defects and the oxide films formed during heating spoil the surface appearance.

In the case of cold rolling, more than 50% reduction by one pass is needed to obtain the tight bonding in a heterogeneous metal combination. Therefore annealing after rolling is necessary to recover the ductility of the product, but formability is deteriorated by intermetallic compounds created during annealing.

To solve these problems, low reduction cold rolling, in which the metal surfaces to be bonded are previously cleaned to improve the weak bonding strength, is tried. For example, as shown in Japanese patent application laid open No. Sho. 59-92186, the product of the oxygen fraction of the atmosphere (weak oxidizing or non oxidizing atmosphere), in which the metals to be bonded are cleaned by shot blasting or wire brushing and rolled, and the time needed from cleaning to rolling, must be controlled within a certain range. But by this method, it is difficult to prevent the absorption of the gas molecules or atoms different than oxygen, such as hydrocarbon, on brushed and cleaned metal surfaces.

Japanese patent application laid open No. Sho. 61-286078, discloses metal surfaces that are cleaned by ion beam milling before cold rolling. But the ion beam milling has some problems for application in an industrial cladding system: (1) radiation diameter is too small; (2) etching rate is insufficient; (3) efficiency of etching tends to be low due to the charging by the radiation of the ion, because many of the oxide films on the metal surface are an insulator; (4) a 50% reduction for cladding and diffusion heat treatment is required; and (5) an ion beam gun costs dearly. Therefore this process is unsuitable to the considerably high speed cladding system for wide clad sheet.

A method of low pressure bonding at room temperature, which is not a method of making a metal clad sheet, was developed. In this method, the metal surfaces to be bonded are cleaned by ion beam milling and then pressure welded in ultra high vacuum at room temperature. (Japanese patent application laid open No. Sho. 54-124853). It is not suitable for an industrial system because it is essential that the pressure welding is carried out in an ultra high vacuum (usually below $10^{-8}$ Torr) to avoid contamination of cleaned surfaces.

SUMMARY OF THE INVENTION

The object of this invention is to provide a method and apparatus for making clad sheets by low reduction cold rolling in a vacuum at room temperature, which is achieved by using available industrial techniques. Another object is to provide a method and apparatus by which clad sheets having a tight bond and good formability free from bond defects, such as brittle alloy, or contaminant gas and oxide in the bond interface, can be manufactured. Still another object is to provide a method and apparatus by which clad sheets of a variety of metals can be combined with other dissimilar metals, which combination is difficult by conventional process. For example, the metals to be bonded may be too hard to obtain a sufficient reduction to unite the metals, or it may be difficult to relieve the stress introduced by cold rolling because the annealing temperature of one is higher than the melting temperature of the other. Examples are the combination of Pb and Fe, and amorphous iron and polycrystalline aluminum.

According to the inventive method of cladding a variety metals with other metals by cold rolling in vacuum of from $1 \times 10^{-6}$ to $1 \times 10^{-3}$ Torr, at a temperature of from room temperature to 300° C., after cleaning pretreatment in a vacuum chamber, the cleaning pretreatment is a RF sputter etching in inert gas of form $1 \times 10^{-4}$ to $1 \times 10^{-1}$ Torr. The glow discharge introduced between the earthed metal electrode to be bonded and the counter electrode by applying the RF power has a frequency from 1 to 50 MHz and the area of the metal cathode exposed in a glow discharge plasma is less than ⅓ of the anode insulated from the earth.

This invention offers apparatus having sputter etching units, each unit including a metal strip holding electrode and an etching chamber which serves as a counter electrode whose skirts neighbor near the holding electrode but insulate the chamber therefrom. The apparatus further includes a cold rolling unit which receives etched metal strip from the etching units. The etching units and the cold rolling unit are located in an evacuated chamber.

BRIEF DESCRIPTION OF THE DRAWINGS

FIG. 11 is a table showing test results for various sheets clad according to the invention.

DETAILED DESCRIPTION OF THE PREFERRED EMBODIMENT

Figure 1:
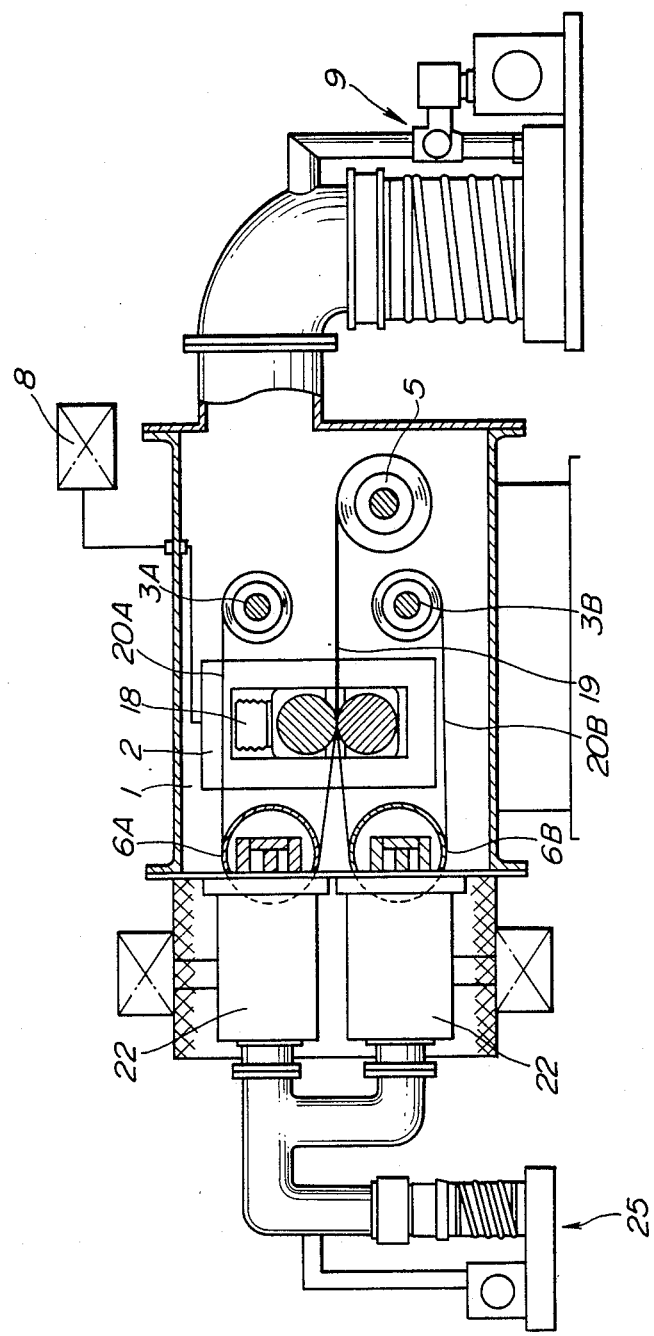
FIG. 1 is a side section view of the apparatus for cladding sheet.

As shown in FIG. 1, the metals strips 20A, 20B to be bonded are drawn from the pay off reels 3A, 3B and pass around electrode rolls 6A, 6B of which each have one part exposed to the etching chamber 22 where the strips are activated by sputter etching. The metals are then cold rolled by the rolling unit 2 in vacuum chamber 1, and the united clad metal 19 is wound around the rewinding reel 5.

It is advisable to set the pay off reels 3A, 3B and rewinding reel 5 in the vacuum chamber 1. In the case of the large plant where large metals coils are handled, they should be installed outside the vacuum chamber because of their cost. In this case, it is essential to use a satisfactory air lock system.

A pressure unit 18 for reduction rolls is set in rolling unit 2. The vacuum chamber 1 is evacuated and maintained within a range from $1 \times 10^{-6}$ to $1 \times 10^{-3}$ Torr by a large vacuum pump. In this example, the pressure unit 18 is an oil cylinder enclosed by airtight flexible bellows shell connected with an airtight pipe to a hydraulic system and control unit 8 installed outside the vacuum chamber 1. A conventional screw down pressure unit can also be used with this invention.

Figure 2:
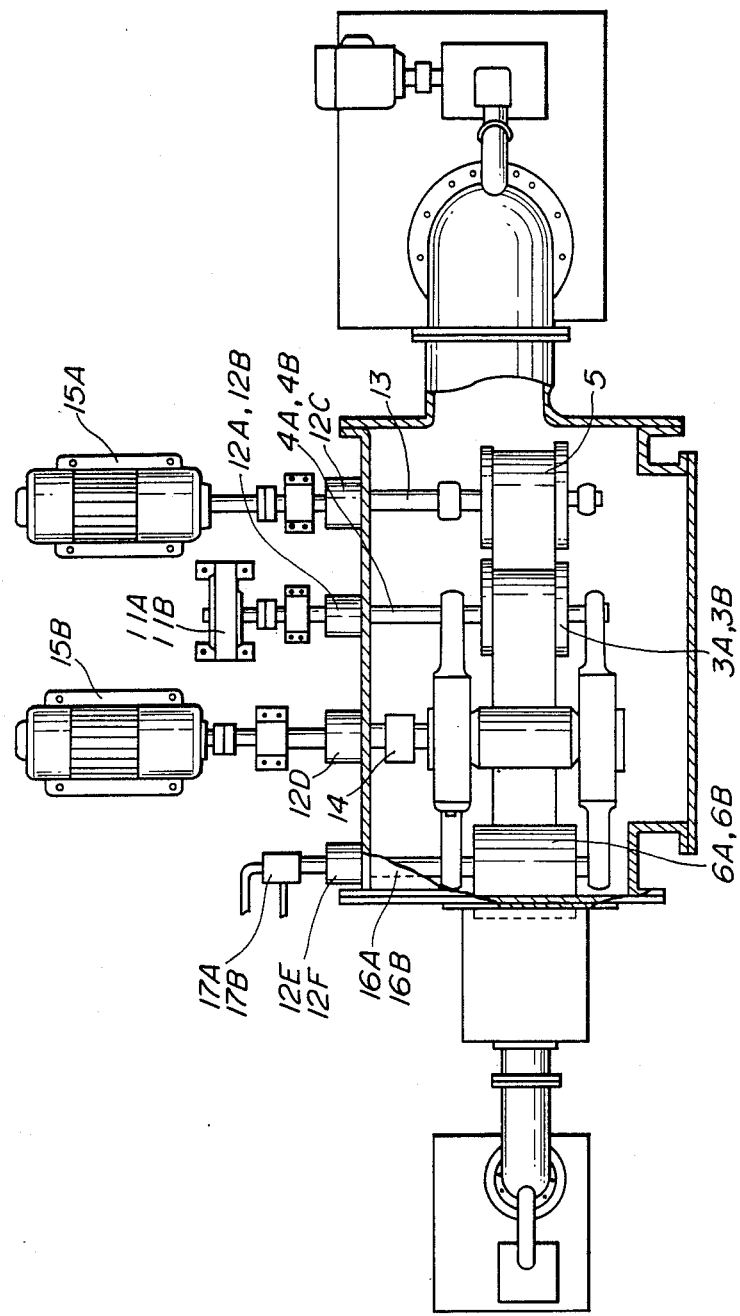
FIG. 2 is a partially cutaway plan view of the apparatus shown in FIG. 1.

Referring to FIG. 2, the rotor shafts 4A, 4B of pay off reels 3A, 3B are connected through vacuum seals 12A, 12B to brakes 11A, 11B for back tension. The motor drive can be also applied to the pay off reels. The rewinding reel 5 is driven by the reel driver motor 15A. The rotor shaft 13 is connected to motor 15A through the vacuum seals 12C of the vacuum chamber 1.

Figure 3:
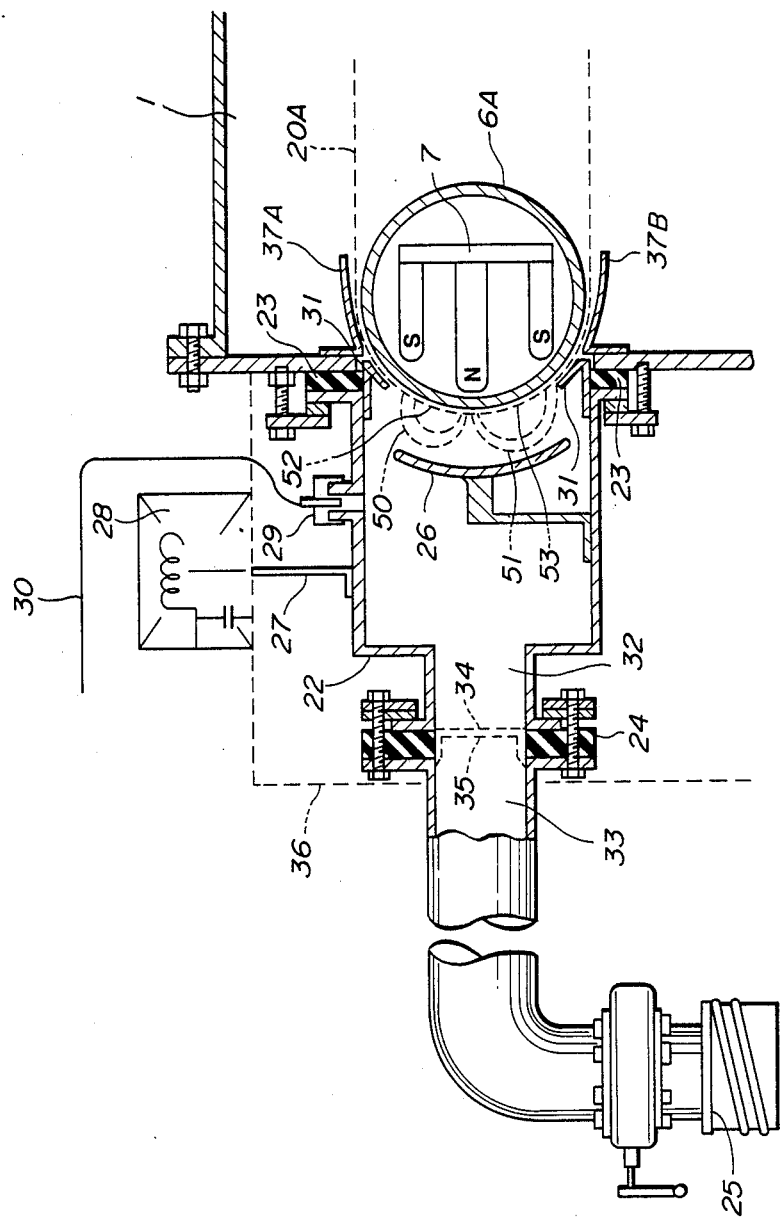
FIG. 3 is an enlarged side section view of an etching chamber shown in FIG. 1.

The bonding rolls are driven by the adjustable speed motor 15B. The roll driving shaft 14 is connected to the motor 15B through vacuum seal 12D in the vacuum chamber 1. The elongated shafts 16A, 16B of metal holding electrodes 6A, 6B have through holes for cooling water and are connected with the rotary joint 17A, 17B for water cooling through the vacuum seals 12E, 12F of the vacuum chamber 1. The guide roll and other attachments for the handling of strips are omitted from this figure. As shown in FIG. 3, the counter electrode 26 is electrically connected to the etching chamber 22 and insulated by airtight insulator packing 23 from vacuum chamber 1. The area of each metal holding roll electrode 6A, 6B exposed to the etching chamber 22, which is the effective etching region (electrode A), should be less than ⅓ of the total inside surface area of counter electrode 26 and the etching chamber 22 (electrode B). Because the bias voltage applied during RF glow discharge plasma ion etching depends on the ratio of area of discharge electrodes and the small electrode becomes cathode, the cathode area (electrode A) should be less than ⅓ of anode area (electrode B). A smaller cathode is more effective and a cathode having about ⅓ the area of the anode provides sufficient etching. The advisable cathode area is less than 1/10 of anode area.

Figure 3A:
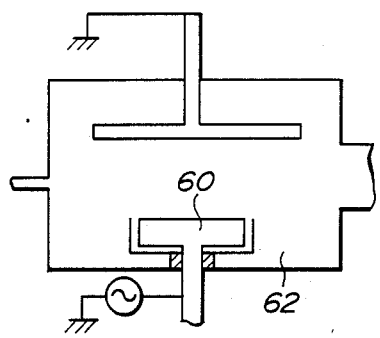
FIG. 3A is a schematic of a conventional RF ion etching apparatus.

The metal holding roll electrode 6A, 6B should be grounded because of the following reasons. In the case of the conventional type of RF ion etching equipment shown in FIG. 3A, the RF power is applied between the etching chamber 62 grounded as an anode and the etching material set on the small cathode 60 electrically insulated from ground.

For etching with conventional equipment, it is essential to apply a high voltage to a large area of metal strip. In this case, all parts, which touch the strip, such as rolling mill, reels, guide and etc., must be insulated from the ground by insulators which can withstand a voltage of several kV. However, this is difficult to apply in an industrial manufacturing system. Therefore, this invention proposes that metal strip should be etched under the condition where the metals are connected to ground potential.

The metal holding electrodes 6A, 6B are water cooled and enclose magnets 7 which apply the magnetron sputtering. While the metal holding electrodes 6A, 6B are bodies of rotation, magnets 7 are fixed in a certain direction, as shown in FIG. 3, and the lines of magnetic force 50, 51 are also kept in a certain direction. The sputter etching mainly occurs at the region 52, 53 enclosed by the lines of magnetic force in the strip width-wide. Therefore, the metal strips 20A, 20B to be bonded are uniformly etched in overall width and length while the strip passes through the etching unit at a constant speed. An additional grounded vacuum pump 25 is attached to the etching chamber 22 with the insulator packing 24. RF power is supplied to the counter electrode 26 in etching chamber 22 with the cable 27. Argon gas is introduced through the insulator pipe 30 and gas inlet unit 29 to the etching chamber 22. The distance from the metal holding electrode 6A, 6B to the skirts 31 of etching chamber 22 is held within a range from 1 to 4 mm, which is within the range of dark space of glow discharge. The skirts 31 are closely set on coaxial circle of the metal holding electrode 6A, 6B to reduce the gas flow of Ar and the sputtered materials from the etching chamber 22 to the vacuum chamber 1. The gas flow in the gap of the skirts 31 and the metal to be bonded 20A, 20B is not laminar flow so that the differential pressure is maintained by reducing the gap. The glow discharge occurs at the connection 33 of the vacuum pump 25 and the exit 32. The glow discharge at the connection 33 can be prevented by the wire meshes 34, 35 which are attached to the exit and the vacuum pump and are set closely to each other. The size of meshes and the gap of meshes should be within a range from 1 to 4 mm, which is determined by the dark space of glow discharge. The etching chamber 22 is set in the shield cover 36 in order to protect from electrical shock and electromagnetic interference. The reasons why this invention uses magnetron plasma etching as the activation treatment of metals are as follows.

The thickness of oxide films of commercial metals is less than 2000 Å, for example those of Ti and Al, which have considerably thick oxides, are about 2000 Å and those of Cu and amorphous metals are less than 100 Å. Surface oxide films can be considerably reduced by wet pretreatment.

The sputter etching, by which high rate etching can be achieved, is an effective activating treatment for metals having a large surface area. By using this method, the area (width) of metal strips can be easily varied by altering the shield shutters which are the skirts of the etching chamber. RF (Radio Frequency) sputter etching is a satisfactory method to remove the insulator oxide films on metal because a stable glow discharge can be maintained. The frequency of power supply should be more than 1 MHz because it is difficult to maintain the stable glow discharge with a frequency smaller than 1 MHz. The higher the frequency of the electric power supplied, the more complicated the circuit becomes.

Therefore the frequency of power supply should be less than 50 MHz. The suitable frequency is 13.56 MHz or 27.1 MHz, which is normally used for conventional RF sputter etching systems.

The sputter etching atmosphere should be maintained within a range of from $1 \times 10^{-4}$ to $1 \times 10^{-1}$ Torr of inert gas, such as Ne, Ar or Xe. Ar gas is suitable for this purpose because of its efficiency and low cost.

The glow discharge plasma forms by supplying RF power to the etching chamber and metal holding electrode when the pressure in the chamber is kept within a range from $1 \times 10^{-4}$ to $1 \times 10^{-1}$ Torr of inert gas. Then the metal surface is satisfactorily activated. When the inert gas pressure is lower than $1 \times 10^{-4}$ Torr, it is difficult to maintain the stable glow discharge and to obtain the high efficiency of etching. On the other hand, when the pressure is higher than $1 \times 10^{-1}$ Torr, the mean free path of sputtered atoms and molecules and the dark space of glow discharge become small. The decrease of the mean free path brings the decrease of the etching efficiency of cleaning treatment. Because the sputtered materials are frequently implanted again in the metal surface and contaminate the surface, the decrease of the dark space of glow discharge makes the structure of skirts (shield shutter) complicated because the gap of skirts and metal holding electrode (including metal strip) should be kept within the thickness of dark space. These are the reasons why the etching pressure should be kept within the range from $1 \times 10^{-4}$ to $1 \times 10^{-1}$ Torr.

Figure 4:
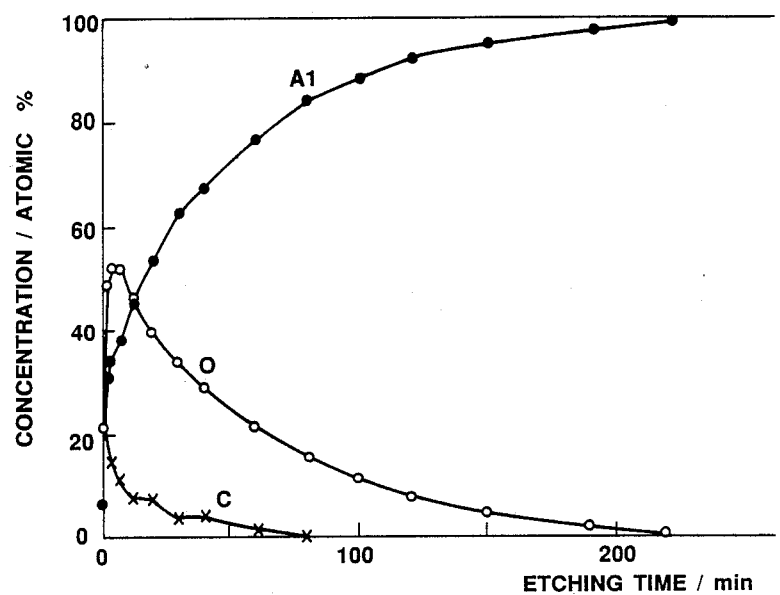
FIG. 4 is a graph showing oxide film removed from aluminum sheet versus etching time.

FIG. 4 is the depth profile of commercial Al sheet sample without wet pretreatment, measured by XPS (X-ray photoelectron spectroscopy) whose etching rate is approximately 10 Å/min. This figure indicates the time required to remove the oxide films on Al sheet.

The magnetron sputter etching rate is sufficiently higher than 1000 Å/min. So the Al sheet can be perfectly activated within a few minutes. In the case of Cu, mild steel or amorphous metals the cleaned surface can be obtained within several seconds. By using this invention, various clad metal sheets, which have different bonding strength to be required, can be manufactured by altering the etching depth (thickness).

Figure 6:
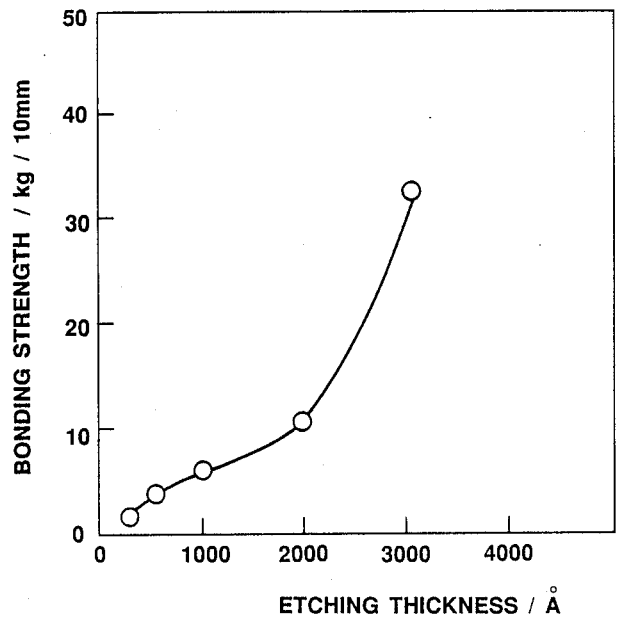
FIG. 6 is a graph showing bonding strength of steel and aluminum sheets versus etching depth of the aluminum.

FIG. 6 illustrates the relation between the bonding strength and the etching thickness when cladding steel sheets 0.23 mm thick, which are completely cleaned by 400Å RF sputter etching in $8 \times 10^{-3}$ Torr of Ar, with the Al sheets of 0.4 mm, whose etching thickness is varied in the same atmosphere, by cold rolling of 5% reduction in $1 \times 10^{-5}$ Torr vacuum at 60° C. The bonding strength increases with the increase of etching depth. For example, in the case of 3000 Å etching where the oxygen is completely removed from the Al surface, the bonding strength is strong enough for the Al sheet to break off without peeling.

Figure 7:
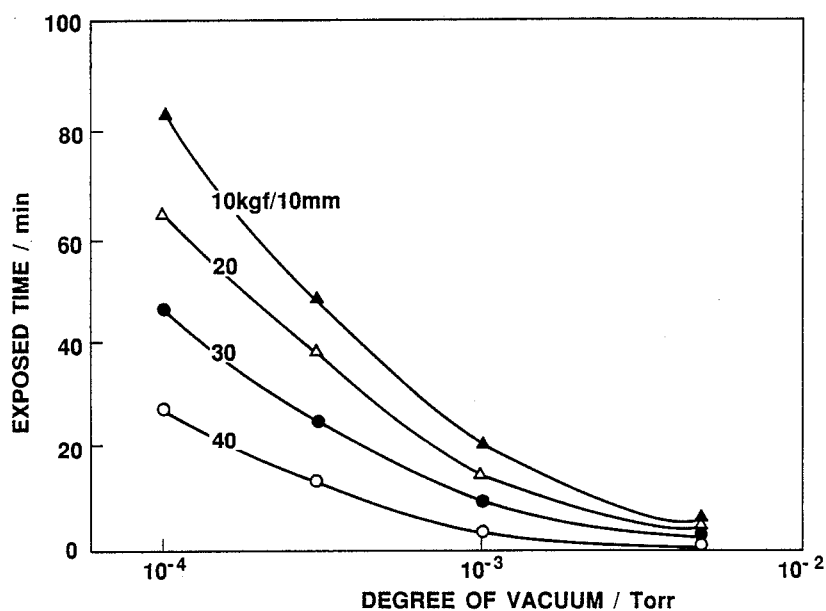
FIG. 7 is a graph showing exposure time to air versus degree of vacuum in the rolling unit to achieve various bonding strengths.

FIG. 7 shows the effects the degree of vacuum, in which the cladding is carried out, on the bonding strength. These are the bonding strength of the clad of the 400 Å etched steel sheets of 0.23 mm thick with the 3000 Å etched Al sheets of 0.5 mm thick, whose surfaces are completely cleaned. The cleaning treatments are carried out by means of RF (13.56 MHz) sputter etching in $3 \times 10^{-3}$ Torr of Ar. The cleaned metal sheets are exposed to various air pressures from $1 \times 10^{-4}$ to $5 \times 10^{-3}$ Torr in a certain period and then cold rolled to unite by 1.5% reduction to the steel at room temperature. For example in $1 \times 10^{-4}$ Torr of air the clad rolling should be carried out within 25 minutes after complete cleaning to manufacture the clad sheet having stronger bonding strength than 40 kg/10 mm. An exposure of 45 min with the same conditions reduces the bonding strength to 30 kg/10 mm. The degree of vacuum of rolling chamber 1 should be made lower to manufacture the tight bond clad sheets stably. The lower limit of the degree of vacuum should be determined by the industrial profitablility. From this point, the lower limit of $1 \times 10^{-6}$ Torr can be easily achieved by conventional oil diffusion pump system. FIG. 7 also indicates the higher limit of pressure; the tight bond clad sheets ts can be manufactured below $1 \times 10^{-3}$ Torr. The atmosphere in the rolling chamber is an important factor affecting the bonding strength. Contaminations of water vapor, oxygen and hydrocarbon, which are the main constitutents in a vacuum chamber evacuated by a conventional oil diffusion pump system, especially decrease the bonding strength. On the other hand, the inert gas, such as He, Ne and Ar, slightly affects the strength.

By using this invention, it is not necessary to heat the metal sheets for cladding. Of course, heating is effective to enhance the deformability of metals and to tighten the bond by diffusion, but it often causes the formation of brittle alloys and carbides and the contamination of the surface with the metalloid elements by surface segregation. A brittle bond is occasionally caused by these phenomena. Furthermore, strain induced by differential thermal expansion due to the heating spoils the shapes of clad sheets. This is the reason why the rolling temperature is maintained under 300° C. In the case of this invention, the temperature of the metals to be bonded is controlled by cooling the metal holding electrode and adjusting the supplied RF power. By this invention, tight bonding can be easily obtained at room temperature if sufficient cooling can be achieved. The temperature tends to be elevated by the increase of RF power supplied, but it is easily maintained below 200° C.

The tight bond clad sheets are manufactured by rolling of from 0.1 to 30% reduction (0.1 R 30) where
T1: thickness of metal sheet to be clad
T2: thickness of metal sheet used as cladding
Tm: the thickness of clad sheet
R: the reduction (%)=(T1+T2−Tm)×100/(T1+T2)

A tight bond is achieved by slight reduction when the metal surfaces are perfectly cleaned and perfectly flat and smooth. But the surface roughness of commercial metal sheets, which we examined, is within a range from 0.045 to 0.33 Ra($\mu$). In the strict sense, the reduction required for tight bond is affected by the surface roughness, the deformability and the ratio of thickness of metals to be bonded. By using smooth metals and the combination of thin soft metal and thick hard metal, the reduction required for a tight bond can be reduced.

In the case of the conventional cold rolling method of cladding, the reduction of rolling has an important role not only in bringing the metal into contact with other metals but also in making the metal surface active. The high reduction by one pass rolling is essential to make a tightly bonded clad sheet because a sufficiently active surface can be obtained at high reduction. Therefore the surface roughness is not so important for the conventional method.

Figure 5:
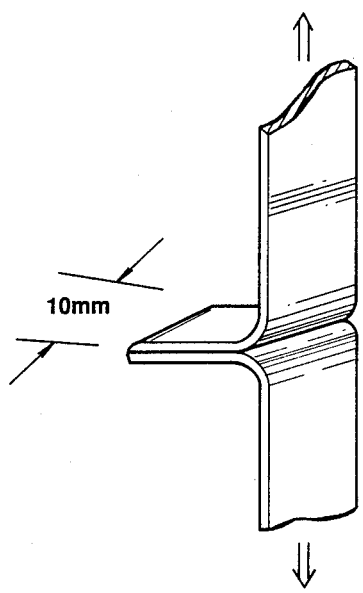
FIG. 5 is a schematic perspective of the T-peel adhesion test.
Figure 8:
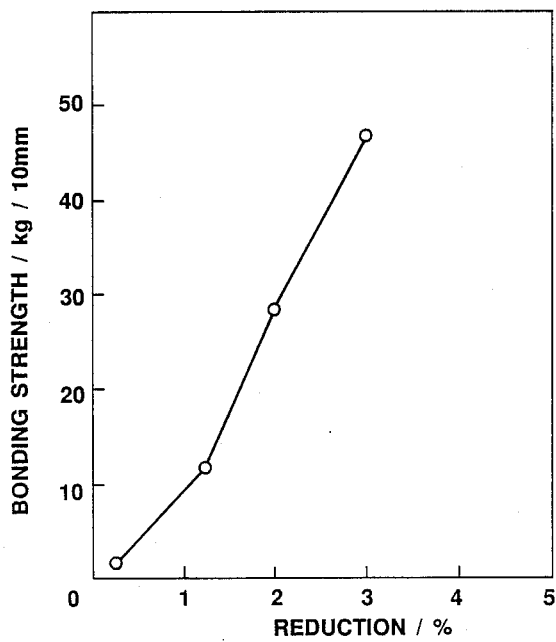
FIG. 8 is a graph showing bonding strength versus thickness reduction by cold rolling.

In the case of this invention, on the other hand, the roughness has an important role in bringing the metal surface into close contact with the other metal surface, because the metal surface is already cleaned enough. For example, as shown in FIG. 8, a tight bond is easily obtained by low reduction. In this case the cleaning treatment is carried out by RF (13.56 MHz) sputter etching in $8\times10^{-3}$ Torr of Ar. The 3000 Å etched Al sheet of 0.26 mm thick is placed with the cleaned surface facing upward and the 400 Å etched steel sheet of 0.32 mm thick is placed on the cleaned Al sheet with the cleaned surface facing downward. Then they are cold rolled to a various reduction in $1\times10^{-5}$ Torr to make a clad sheet. The temperature of metals to be bonded are kept below 60° C. The bonding strength clad sheet is measured by T-peel adhesion test. The T-peel test pieces are cut in the size of 10 mm wide as shown in FIG. 5. The bonding strength at 0.1% reduction is about 1 kg/10 mm and the strength increases with the increase of reduction as shown in FIG. 8. The 3% reduction of rolling makes the clad sheet tight enough for the Al to break off. The several percent reduction is sufficient to make a tight bond. The excess reduction is available to temper the clad sheet. Above 30% reduction formability is significantly reduced by work hardening. FIG. 11 is a table showing the results of various adhesion tests carried out by using the examples of this invention and the comparisons. The clad sheets are manufactured according to the invention and the comparisons are made under conditions outlined for the invention. The time required from the end of activating treatment to rolling is about one and half minutes. The adhesion tests are the T-peel test as mentioned above, Erichsen test and 180 degree bending test. The rating is indicated by marks in which ⊚ is good, Δ is partially peeled and × is poor. These results show that tightly bonded clad sheets can be manufactured by this invention.

Figure 9:
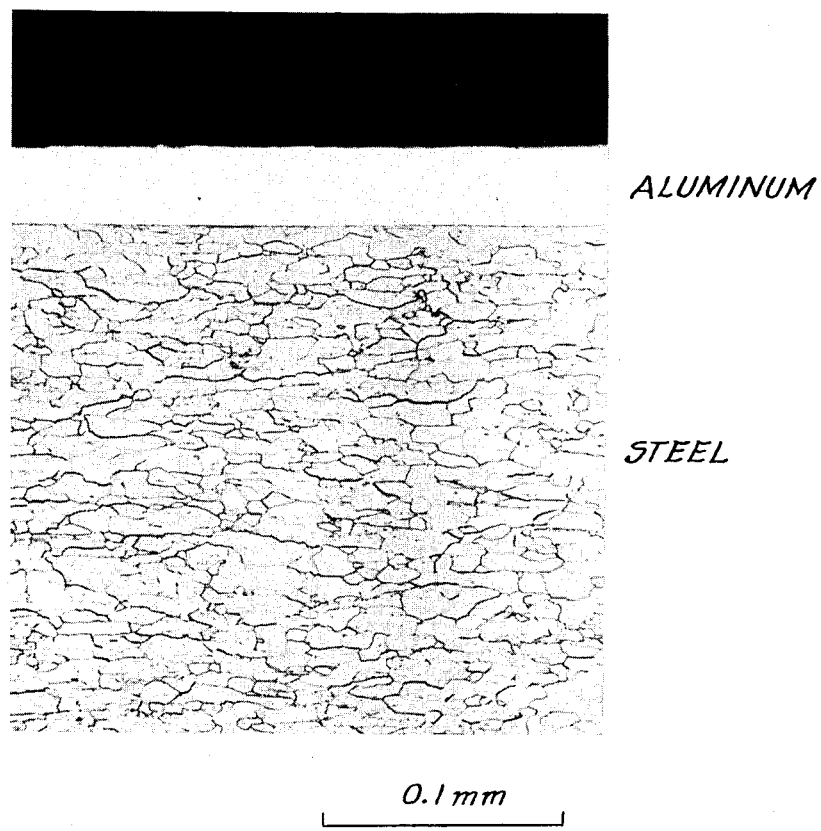
FIG. 9 is a cross section of an Fe/Al clad sheet.
Figure 10:
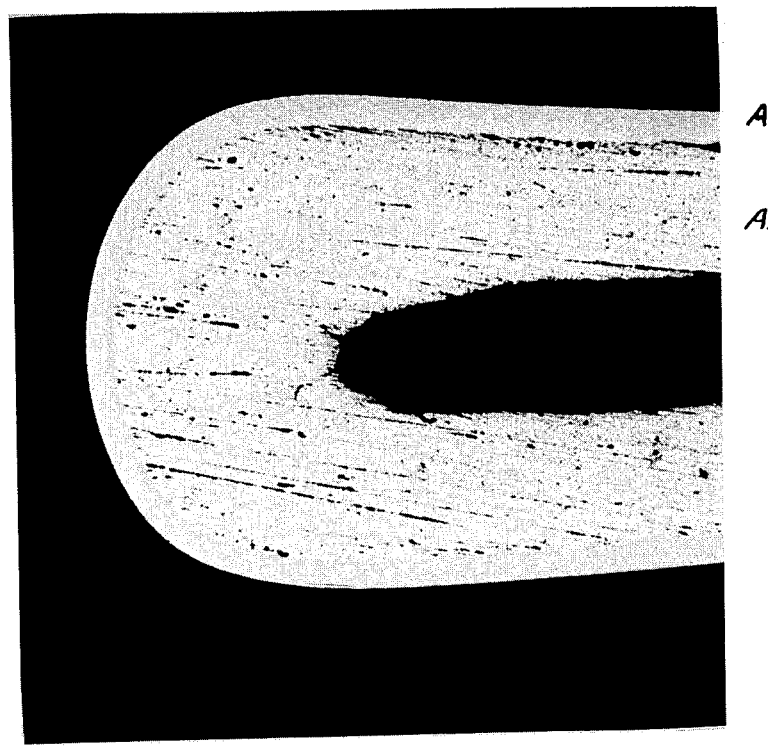
FIG. 10 is a cross section of an Al/amorphous metal clad sheet.

FIGS. 9 and 10 show the photomicrographs of the cross section of the clad sheets manufactured by this invention. FIG. 10 shows the clad of 2000 Å etched Al of 0.26 mm thick with the 100 Å etched Fe-Ni-Cr-Si-B amorphous metal sheet of 0.06 mm thick. They are substantially sputter etched in $8\times10^{-3}$ Torr of Ar. Then their cleaned surfaces are brought into contact with one another and they are cold rolled to 3% reduction in $1\times10^{-5}$ Torr of vacuum to unite the surfaces into a tight bond at 45° C. FIG. 10 shows the cross section of the 180 degree bending test piece. It shows tightly bonded structure.

FIG. 9 shows the cross section of Al clad steel sheet. The steel sheet of 0.23 mm thick is cleaned by 400 Å etching in $3\times10^{-3}$ Torr of Ar, and the Al sheet of 0.030 mm thick is cleaned by 2000 Å etching in the same atmosphere. They are cold rolled to 0.5% reduction to unite in $3\times10^{-5}$ Torr vacuum at 45° C. The structure of steel is revealed by nital etchant. Intermetallic compounds are not observed in the interface of metals. And the annealed structure of steel is not destroyed because of its low reduction.

This invention provides the method and equipment for cladding seeets of a variety of metals with other metals, where the clad sheets cannot be manufactured by the conventional method. Such as, (1) the combination of high and low melting point metals (example stainless steel and Al, Pb and Fe, etc.)

(2) materials which change with heating (example amorphous metals)

(3) the active metals (Mg, Ti, etc.)

(4) the combination of metals which brittle alloys upon heating (example Al and Fe, Al and Ti, etc.).

What is claimed is:

1. A method of cladding one of a variety of metals with another dissimilar metal, comprising the following steps:
    (a) holding the metals to be bonded against grounded metal holding electrodes, said electrodes acting as cathodes;
    (b) providing an anode for cooperation with each cathode, each anode being insulated from ground and having a surface area over three times larger than the surface area of the cathode which is exposed to said anode;
    (c) exposing the metals to be bonded to an inert gas at a pressure of from $1\times10^{-4}$ to $1\times10^{-1}$ Torr between said anodes and said cathodes;
    (d) sputter etching the metals by glow discharge plasma by supplying RF power with a frequency from 1 to 50 MHz to the cathodes and the respective anodes, thereby substantially removing the oxides from the surface of the metals to be bonded;
    (e) bringing the cleaned surfaces into contact with one another;
    (f) maintaining a vacuum of from $1\times10^{-6}$ to $1\times10^{-3}$ Torr where said surfaces are brought into contact;
    (g) maintaining a temperature from room temperature to 300° C. where said surfaces are brought into contact; and
    (h) urging the surfaces together at a pressure sufficient to effect a reduction in thickness of from 0.1 to 30%.

2. The method of claim 1 wherein the metal to be clad and the dissimilar cladding metal are in sheet form, the metal holding electrodes being rollers, each sheet passing around the respective roller where it is exposed to said glow discharge plasma and etched thereby.

3. Apparatus for cladding a strip of one of a variety of metals with a dissimilar cladding metal, said apparatus comprising a sputter etching unit comprising
    an etching chamber electrically connected to an anode therein, and
    a grounded metal holding electrode which acts as a cathode, said electrode being in the form of a roller which receives a strip of metal thereabout and passes said strip adjacent to said anode;
    skirts between said chamber and said metal holding electrode, said skirts extending very close to said roller to maintain a pressure differential in said chamber, said skirts electrically insulating said anode from said cathode.

4. Apparatus as in claim 3 further comprising a vacuum rolling unit to unite the metals into a clad strip.

5. Apparatus as in claim 4 further comprising a rewinding reel for the clad strip.

6. Apparatus as in claim 3 further comprising a payoff reel for feeding a strip of the metal to be clad, and a pay off reel for feeding a strip of the cladding metal.

7. Apparatus as in claim 6 further comprising a vacuum chamber containing said payoff reels and at least one said RF sputter etching unit therein.

8. Apparatus as in cliam 6 further comprising a vacuum chamber containing at least one said RF sputter etching unit therein, said payoff reels being external to said vacuum chamber, said apparatus further comprising an air lock system for recieving strip into said chamber from said reels.

9. Apparatus as in claim 3 wherein said apparatus further comprises magnets within each metal holding electrode, said magnets being stationary relative to said sputter chamber and providingthe necessary magnetic field for magnetron sputter etching the metal strip on the cathode.

10. Apparatus as in claim 3 comprising more than two said sputter etching units.

* * * * *